United States Patent
Lazzery

[11] 4,012,117
[45] Mar. 15, 1977

[54] LIQUID CRYSTAL MODULE
[75] Inventor: Angelo Gino Lazzery, Oaklyn, N.J.
[73] Assignee: RCA Corporation, New York, N.Y.
[22] Filed: July 29, 1974
[21] Appl. No.: 492,671
[52] U.S. Cl. ................. 350/160 LC; 339/17 L; 339/176 M; 339/176 MP; 361/395
[51] Int. Cl.² ........................................ G02F 1/13
[58] Field of Search ......... 350/160 LC; 317/101 F, 317/101 CC; 339/17 L, 75 M, 176 M, 176 MP

[56] References Cited
UNITED STATES PATENTS
3,718,842  2/1973  Abbott ................. 317/101 CC

*Primary Examiner*—Edward S. Bauer
*Attorney, Agent, or Firm*—Glenn H. Bruestle; Birgit E. Morris

[57] ABSTRACT

The module comprises a carrier on which a semiconductor chip is mounted, and a plurality of terminals to which various outputs of the chip are electrically connected, the terminals comprising metallized areas on one surface of the carrier. A liquid crystal cell is mounted within a frame including means for securing the frame to the carrier, resilient connector means being clamped between the liquid crystal cell and the carrier for electrically connecting different ones of the carrier terminals to different ones of electrodes of the cell.

9 Claims, 10 Drawing Figures

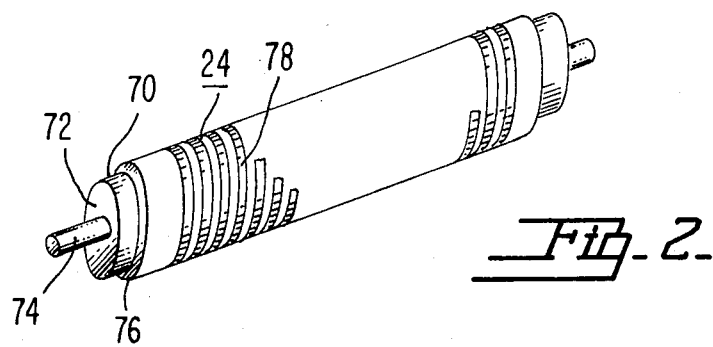
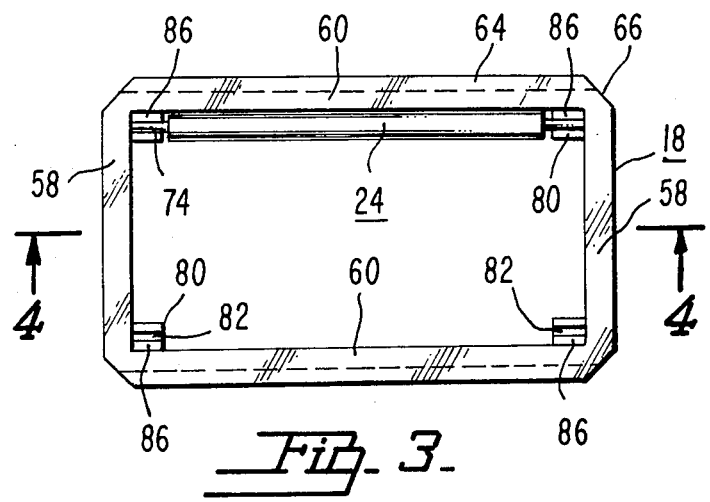
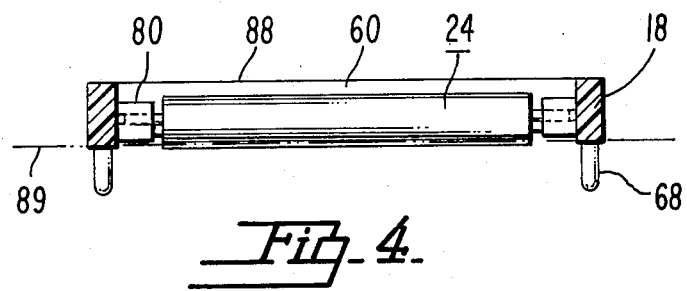
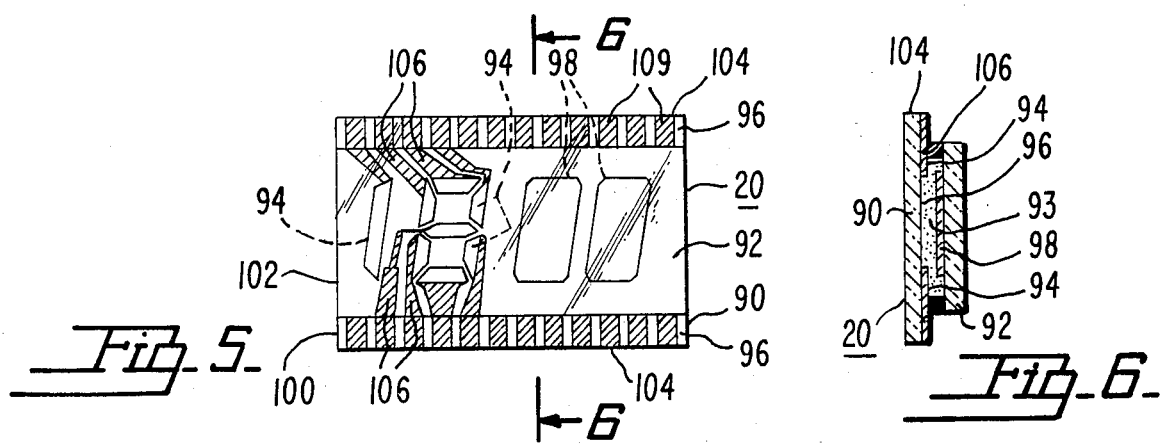

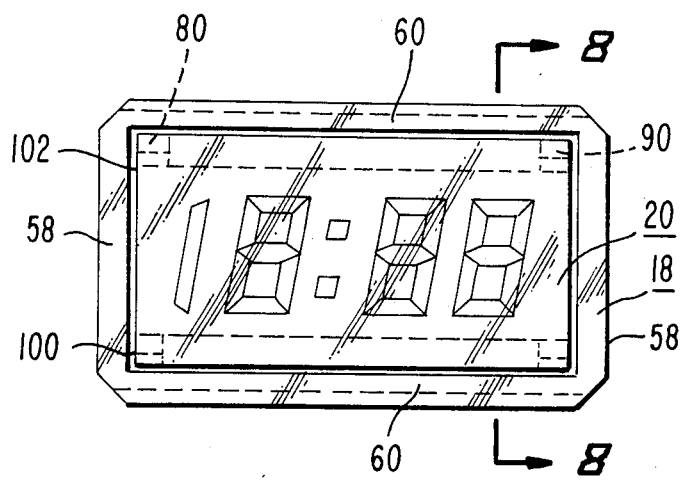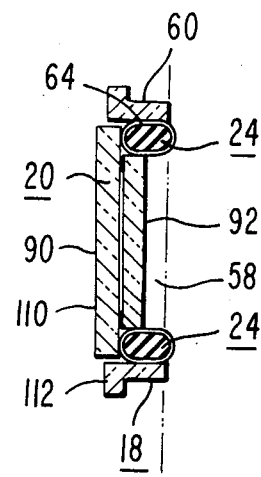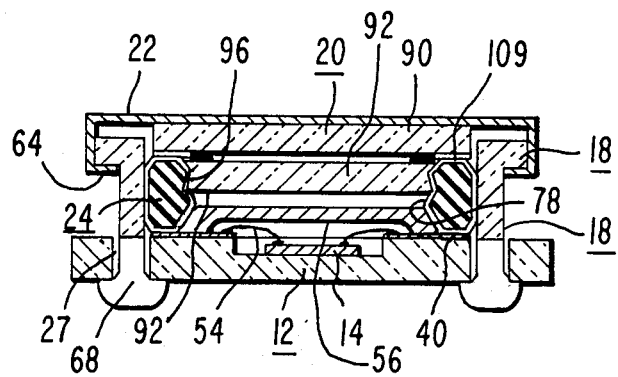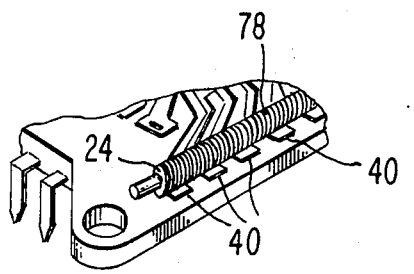

LIQUID CRYSTAL MODULE

This invention relates to liquid crystal devices, and particularly to liquid crystal watch modules.

By a liquid crystal watch module is meant, for example, an assembly comprising a liquid crystal cell for displaying images, e.g., digits indicative of the time of day, a semiconductor integrated circuit including various circuit means for generating electrical signals to actuate the liquid crystal cell, and means for interconnecting the integrated circuit with various electrodes on the liquid crystal cell, the interconnecting means preferably providing a compact, self-contained, and relatively rigid assembly that can be handled, tested, and transported.

While such modules are generally known, there is room for improvement therein, especially with respect to the electrical connectors.

FIG. 2 is a perspective view of an electrical connector used in the module.

FIG. 3 is a plan view of a frame used in the module.

FIG. 4 is a cross-sectional view taken along line 4—4 of FIG. 3.

FIG. 3 is a bottom view of a liquid crystal cell used in the module, some of the electrodes of the cell being omitted for greater clarity of illustration.

FIG. 6 is a cross-sectional view taken along line 6—6 of FIG. 5.

FIG. 7 is a plan view showing the fitting of the cell shown in FIG. 5 within the frame shown in FIG. 3.

FIG. 8 is a cross-sectional view taken along line 8—8 of FIG. 7.

FIG. 9 is a cross-sectional view of the module.

FIG. 10 is a perspective view of a segment of the module showing the contacting of the electrical connector with certain terminals of the module.

Figure 1:
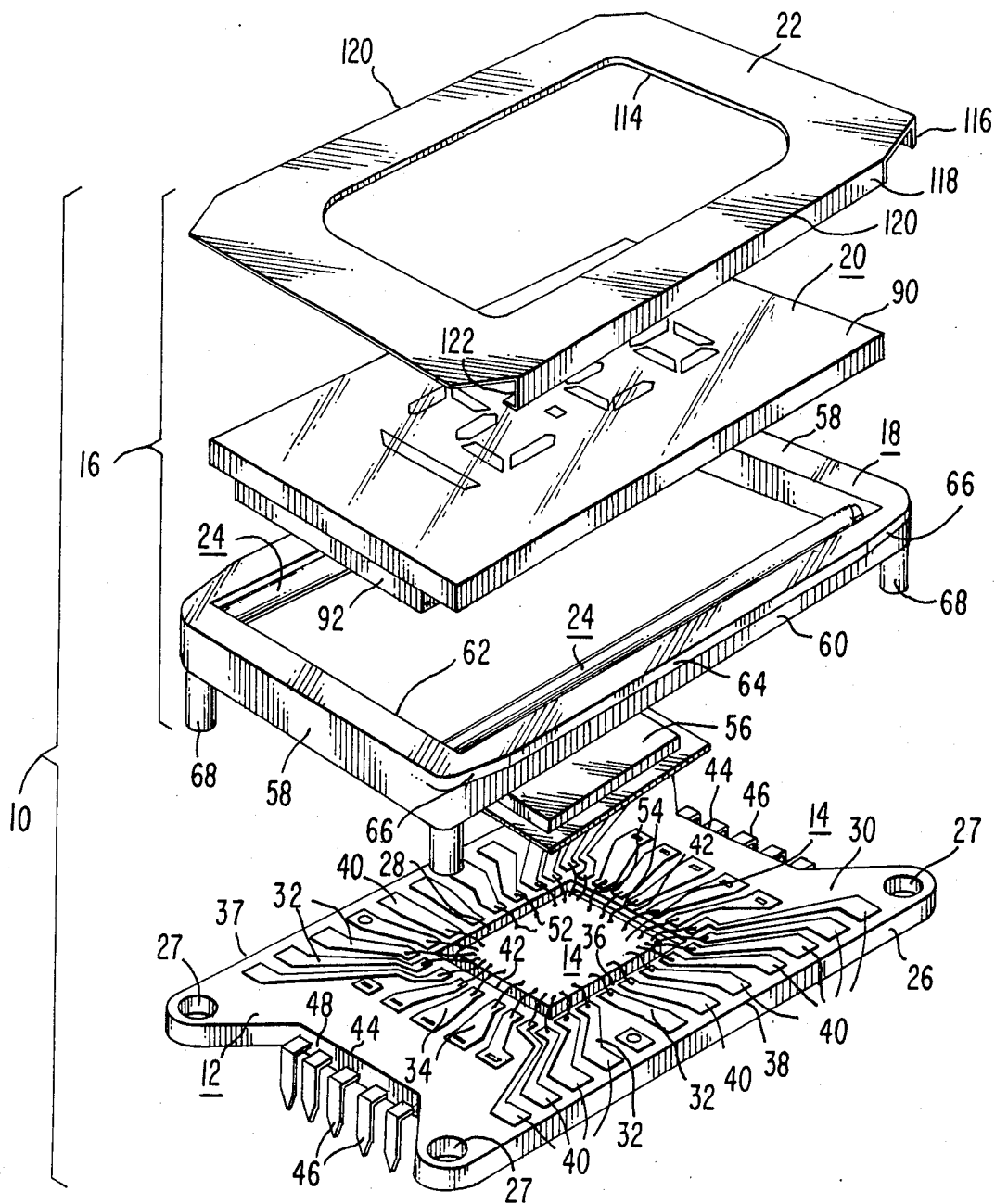
FIG. 1 is an exploded view, in perspective, of a liquid crystal watch module in accordance with this invention.

With reference to FIG. 1, a module 10 in accordance with this invention is shown. The module 10 comprises two sub-assemblies including a carrier 12 on which a semiconductor chip 14 is mounted, and a unit 16 comprising a frame 18 for receipt therein of a liquid crystal cell 20. A pressure plate 22 cooperates with the frame 18 for clamping the liquid crystal cell 20 within the frame 18 in firm contact with a pair of electrical connectors 24.

The carrier 12 comprises a flat plate 26 of an insulating material, e.g., plastic or ceramic, having four openings 27 therethrough at corners of the plate 26, a central recess or cavity 28 through the upper surface 30 of the plate 26, and two sets of conductive paths 32 and 34 on the surface 30. The paths 32 are disposed on two of the opposite sides of the cavity 28, and each extends from adjacent one of the opposite edges 36 of the cavity 28 towards an edge 38 of the plate 26 and terminates closely thereto. The outer ends of these paths 32 comprise terminals 40 to which electrodes of the cell 20 are connected, as hereinafter described.

The other paths 34 are disposed opposite the other two sides of the cavity 28, and each extends from one of the other opposite edges 42 of the cavity 28 towards the plate edges 44. Each is connected, via conductive paths (not shown) embedded within the plate 26, to a different one of a plurality (5 shown) of rigid terminal pins 46 extending outwardly and downwardly from opposite sides 48 of the plate 26. The conductive paths 32 and 34, including the embedded paths, can comprise, for example, copper clad gold.

The fabrication of the carrier 12 can be in accordance with known techniques. For example, the embedded conductive paths can be provided by laminating together at least two plates each having conductive paths on the surfaces thereof, openings being provided through one of the plates to interconnect, via conductive material disposed within the openings, various conductive paths on the two plates.

Disposed within the cavity 28 of the plate 26 is the semiconductor integrated circuit chip 14 of known type including various counting and encoding means for generating electrical signals suitable for driving a liquid crystal cell. Details of the chip 14 are not provided since such chips and the functions performed thereby in liquid crystal watch devices are known. The chip 14 includes a number of terminals 52, and a plurality of fine wires 54 interconnect each of the chip terminals 52 with different ones of the various paths 32 and 34 on the plate 26.

In this embodiment, various inputs to the semiconductor chip 14, e.g., power and timing signals, can be connected to the chip 14 through the pins 46 and the paths 34, the pins 46 being adapted to be inserted into, for example, a printed circuit board (not shown) of known type including a battery for power and a quartz crystal for the timing signals, and the like.

To prevent damage to the chip 14 or the fine wires 54, a cover or cap 56 of, e.g., plastic, is preferably mounted over the cavity 28 and sealed, as with an insulating epoxy cement, to the surface 30 of the plate 26 beyond the point of contact of the various wires 54 with the inner ends of the various paths 32 and 34.

The frame 18 of the unit 16 is of an insulating material, e.g., a known plastic and includes two short sides 58 and two long sides 60 defining a large rectangular opening 62. Each of the two long sides 60 includes a laterally extending flange 64 having tapered ends 66, and the frame 18 further includes four dependent pegs 68 at corners thereof, the purpose of the pegs 68 being to lock the unit 16 to the carrier 12, as described below.

Disposed within the frame 18 and against the long sides 60 thereof are the connectors 24. As shown in FIG. 2, each connector 24 comprises an elongated, solid cylinder 70 of oblong cross-section, the cylinder 70 being of a resilient material, e.g., rubber. Extending through the cylinder 70 along the longitudinal axis thereof and outwardly from the ends 72 thereof is a wire 74 the purpose of which is to facilitate mounting of the connectors 24 on the frame 18, as described below.

Disposed about the cylinder 70, as by being wrapped thereabout and cemented, is a sheet 76 of an insulating material, e.g. a known plastic such as "Mylar," having a plurality of spaced apart, at least partially encircling lines 78 of conductive material, e.g., gold plated copper, parts of some of which are broken away in FIG. 2.

The connectors 24 can be made by known means. For example, the cylinder 70 can be made by extrusion, and the conductive lines 78 can be made by depositing on the insulating sheet 76 a layer of copper coated by a "flash" of gold, and etching away portions of the copper using known photolithographic techniques to provide the spaced apart lines 78.

As shown in FIGS. 3 and 4, each corner of the frame 18 is provided on the inside thereof with a protrusion 80 containing a slot 82 parallel to the long sides 60 of the frame. The two slots 82 adjacent to each long side 60 are coaxial and their spacing from the adjacent side 60 is determined by the thickness of the intermediate portion of the protrusion 80, here termed a slot wall 86.

The connectors 24 are fixedly mounted within the frame 18 by disposing the extending ends of the cylinder wire 74 within the pair of slots 82 along the same long side 60, the wires preferably fitting snugly within the slots, and the thickness of the slot walls 86 providing a relatively snug fit of the connectors 24 against the long sides 60. Owing to the oblong cross-section of the connectors 24, and the contact thereof with the frame sides 60, rotation of the connectors 24 is prevented.

As shown in FIG. 4, when the connectors 24 are in place within the frame 18, the upper surfaces of the connectors 24 are disposed slightly below the upper surfaces 88 of the frame sides 60, thus forming an internal ledge or seat for receipt within the frame of the liquid crystal cell 20. Also, the lower surfaces of the connectors 24 are disposed slightly below the plane 89 of the lower surfaces of the frame sides 60 for the purpose, as described below, of making electrical contact with the conductive paths 32 on the carrier 12.

The liquid crystal cell 20 can be of known type comprising, for example, a pair of substrates 90 and 92 of transparent glass, as shown in FIGS. 5 and 6, a liquid crystal material 93 sealed between the substrates, a plurality of electrodes 94 (only some of which are shown) on the inside surface 96 of the substrate 90, and a plurality of electrodes 98 on the inside surface of the substrate 92 (various electrodes on the substrate 90 being omitted from the FIG. 5 drawing for visibility of the electrodes 98 on the substrate 92), different ones of the electrodes 98 being disposed opposite various sets of electrodes 94 in accordance with a generally known pattern of electrodes. By applying a voltage between an electrode 98 and various ones of the electrodes 94 opposite thereto, the liquid crystal material between the energized electrodes is "activated," thus providing an optical display corresponding to the configuration of the energized electrodes 94.

As shown, the cell 20 is generally rectangular in shape, the substrates 90 and 92 being of the same length, but the substrate 92 being of less width than and centered with respect to the substrate 90. Thus, portions of the inner surface 96 of the substrate 90 are exposed along the long sides 104 of the substrate 90. A plurality of conductive paths 106 are disposed on the inside surface 96 of the substrate 90, each path 106 extending from a different electrode 94 to an edge of the substrate 90. Also, various ones of the paths 106 are electrically connected to different ones of the electrodes 98 on the substrate 92 by means of connectors of known type (not shown) bridging the space between the substrates. The outer ends of the conductive paths 106 comprise terminals 109 for the cell electrodes 94 and 98, the terminals 109 being disposed in a pattern corresponding in shape and dimensions to the pattern of the terminals 40 (FIG. 1) on the carrier 12.

As shown in FIGS. 7 and 8, the cell 20 is dimensioned to fit within the frame 18, the cell "lower" substrate 92 fitting, with a small space to spare, between the connectors 24, and the long sides 104 of the substrate 90 (which extend beyond the substrate 92) resting on the "seat" provided by the upper surfaces of the connectors 24. Also, each of the sides of the substrate 90 fit within and relatively closely to the corresponding sides of the frame 18, the frame sides providing accurate positioning of the cell 20 within the frame 18. Additionally, when the cell 20 is disposed within the frame 18, the upper surface 110 (FIG. 8) of the substrate 90 is disposed slightly, e.g., 20 mils (0.5 mm), above the upper surface 112 of the frame flanges 64, the purpose of this being to provide positive engagement between the pressure plate 22 and the cell 20, as described below.

The pressure plate 22 (FIG. 1) is of thin and thus resilient sheet metal, e.g., 5 mils (0.125 mm) thick stainless steel, of rectangular shape, and includes a central aperture 124. The plate 22 also includes a dependent flange 116 at one end thereof and a pair of dependent flanges 118 along opposite sides 120 of the plate forming a pair of elongated, oppositely disposed U-shaped channels 122.

The assembly of the module 10 is as follows.

The connectors 24 are disposed within the frame 18 by disposing (FIGS. 3 and 4) the wires 74 within the frame slots 82. The liquid crystal cell 20 is then disposed within the frame 18 (FIGS. 7 and 8) to fit therein as previously described. The pressure plate 22 is then added to the frame 18 for clamping the liquid crystal cell 20 between the pressure plate 22 and the connectors 24. This is accomplished by first disposing the plate 22 in endwise alignment with the frame 18, inserting the frame flanges 64 into the plate channels 122, and sliding the plate 22 onto the frame until the frame dependent flange 116 engages one of the short sides 58 of the frame.

As previously noted, the upper surface 110 (FIG. 8) of the cell 20 within the frame 18 is disposed slightly above the upper surface 112 of the flanges 64. The width of the plate channels 122 is such that the plate 22 presses (FIG. 9) the cell 20 downwardly into the frame 18 and firmly against the resilient connectors 24. Some slight deformation of the connectors 24 thus occurs, the connectors bowing out slightly towards and against the cell lower substrate 92. While not illustrated, corners of the substrate 90 engage the upper surfaces of the frame projections 20 (see FIGS. 4 and 7), the projections 80 thus serving as stops to limit the pressure applied against the resilient connectors 24.

The combination of the deformed, resilient connectors 24 and the pressure plate 22 engaged with the frame flanges 64 provides a relatively rigid and tight fitting assemblage of parts, the cell 20 being rigidly clamped between the plate 22 and the connectors 24. Also, the exposed terminals 109 on the inside surface 96 of the substrate 90 are firmly clamped against the conductive lines 78 on the connectors 24.

The carrier 12 is assembled with the integrated semiconductor chip 14, the interconnecting wires 54, and the cover 56 as previously described. Then, to complete the module 10, the pegs 68 of the frame 18 are inserted through and slightly beyond the openings 27 through the carrier 12, thus aligning the terminals 109 for the various electrodes 94 and 98 of the cell 20 with the corresponding terminals 40 for the chip 59 on the carrier 12. Compressive pressure is then applied to the assemblage to firmly press the lower portions of the connectors 24 (which, as previously noted, extend slightly below the lower surface plane 89 of the sides 60 of the frame, see FIGS. 4 and 8) against the carrier terminals 40, and the portions of the pegs 68 extending beyond the carrier openings 27 are heated and deformed against the undersurface of the carrier 12 to rivet the module 10 together in compressive relationship.

As described, the resilient connectors 24 are compressed between opposite surfaces on which the various terminals 40 and 109 are disposed. This provides a positive electrical connection between the various lines 78 on the connectors 24 and the aligned terminals 40 and 109.

Preferably, the width of each conductive line 78 on the connectors 24 is less than the minimum spacing between adjacent terminals of either set of terminals 40 and 109. Thus, there is no danger of adjacent terminals being shorted together by the conductive lines 78. Also, a large number of closely spaced apart lines 78 are preferably used, thereby insuring contact by one and preferably several conductive lines 78 with each terminal 40 and 109. Advantages of this are that there is thus no need to carefully align individual lines 78 with individual terminals 40 and 109, and, with several lines contacting each of the terminals 40 and 109 (as shown in FIG. 10 with respect to the terminals 40), the degree of necessary accuracy in the alignment of the various terminals 40 and 109 with respect to one another is also reduced. Additionally, provided the above-noted dimensional relations are observed, the connectors 24 are "universal" in the sense that they can be used in different modules having somewhat different terminal patterns.

For example, in one embodiment, 12 terminals 40 are disposed on either side of the carrier 12 in vertical alignment with 12 terminals 109 on either side of the cell 20, the minimum spacing between adjacent terminals 40 or 109 being 20 mils (0.50 mm), and the width of each terminal 40 and 109 being 40 mils (1.01 mm). The lines 78 on the connectors 24 have a width of 3 mils (0.07 mm), and are spaced apart a distance of 4 mils (0.1 mm).

What is claimed is:

1. A liquid crystal assembly comprising:
   a carrier having a surface and an array of first metallized paths on said surface,
   a semiconductor integrated circuit mounted on said carrier, different terminals of said circuit being electrically connected to different ones of said first metallized paths,
   an apertured frame, an electrical connector mounted within said frame,
   said connector comprising a body of resilient material having an oblong cross section and a plurality of conductive lines on the outside surface of said body wherein the width of said conductive lines is less than the spacing between adjacent ones of said first and second metallized paths,
   a liquid crystal cell comprising a substrate in contact with a liquid crystal material and an array of second metallized paths on an exposed surface of said substrate, and
   means for mounting said cell and said carrier on opposite sides of said frame with said connector clamped and resiliently deformed therebetween, such that said connector conductive lines resiliently press against each path of a different pair of said first and second metallized paths to provide an electrical connection therebetween.

2. The assembly of claim 1 in which at the areas of contact of said conductive lines with said metallized paths, the widths of said conductive lines are less than the widths of said paths.

3. The assembly of claim 1 in which said connector includes a covering sheet of insulating material, said conductive lines comprising metallized areas on the outside surface of said sheet.

4. The assembly of claim 1 in which said mounting means include a pair of slots formed interiorly of said frame and extending in a direction parallel to said frame side, said connector body including a pair of wires extending outwardly from opposite sides thereof, said wires being disposed relatively snugly within said slots.

5. The assembly of claim 1 in which said frame is a relatively flat member having upper and lower surfaces, said connector having upper and lower surfaces disposed respectively adjacent to said frame upper and lower surfaces, said conductive lines extending between said connector upper and lower surfaces, and
   said cell and said carrier engaging a different one of said connector upper and lower surfaces.

6. The assembly of claim 5 in which said connector upper surface is disposed interiorly of said frame, whereby said connector upper surface, along with an inside surface of said frame, provide a seat for receipt thereon of said cell.

7. The assembly of claim 5 in which said connector lower surface is disposed, in its undeformed state, exteriorly of said frame and slightly beyond said lower surface thereof, the lower surfaces of said frame and said connector being compressively engaged with said surface of said carrier.

8. The assembly of claim 7 in which said frame includes downwardly extending pegs extending through openings through said carrier, the leading ends of said pegs being deformed to serve as rivot heads securing said frame to said carrier.

9. The assembly of claim 1 in which said carrier has a cavity through said surface thereof, said semiconductor circuit is mounted within said cavity, and including a cap bonded to said surface enclosing said semiconductor circuit.

* * * * *